United States Patent
Dias et al.

(10) Patent No.: US 10,206,277 B2
(45) Date of Patent: Feb. 12, 2019

(54) GRADIENT ENCAPSULANT PROTECTION OF DEVICES IN STRETCHABLE ELECTRONICS

(71) Applicant: Intel Corporation, Santa Clara, CA (US)

(72) Inventors: Rajendra C. Dias, Phoenix, AZ (US); Manish Dubey, Chandler, AZ (US); Tatyana N. Andryushchenko, Beaverton, OR (US); Aleksandar Aleksov, Chandler, AZ (US); David W. Staines, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 186 days.

(21) Appl. No.: 14/975,162

(22) Filed: Dec. 18, 2015

(65) Prior Publication Data

US 2017/0181275 A1 Jun. 22, 2017

(51) Int. Cl.
*H05K 1/00* (2006.01)
*H05K 1/02* (2006.01)
(Continued)

(52) U.S. Cl.
CPC .......... *H05K 1/0283* (2013.01); *A41D 1/002* (2013.01); *A43B 3/0005* (2013.01);
(Continued)

(58) Field of Classification Search
CPC .......... H01L 24/50; H01L 2224/16225; H05K 1/0277; H05K 1/0278; H05K 1/028;
(Continued)

(56) References Cited

U.S. PATENT DOCUMENTS 8,861,220 B2 * 10/2014 Loher ................. H05K 1/0283
174/254
9,211,537 B2 * 12/2015 Hansen ............... G06F 3/04842
(Continued)

FOREIGN PATENT DOCUMENTS

KR 2015-0115019 10/2015
WO WO-2014124044 8/2014

OTHER PUBLICATIONS

International Search Report & Written Opinion for Application No. PCT/US2016/055801, dated Jan. 20, 2017, 9 pages.
(Continued)

*Primary Examiner* — Pete T Lee
(74) *Attorney, Agent, or Firm* — Schwabe, Williamson & Wyatt, P.C.

(57) ABSTRACT

In accordance with disclosed embodiments, there are provided methods, systems, and apparatuses for gradient encapsulant protection of devices in stretchable electronic. For instance, in accordance with one embodiment, there is an apparatus with an electrical device on a stretchable substrate; one or more stretchable electrical interconnects coupled with the electrical device; one or more electrical components electrically coupled with the electrical device via the one or more stretchable electrical interconnects; and a gradient encapsulating material layered over and fully surrounding the electrical device and at least a portion of the one or more stretchable electrical interconnects coupled thereto, in which the gradient encapsulating material has an elastic modulus greater than the stretchable substrate and in which the elastic modulus of the gradient encapsulating material is less than the electrical device. Other related embodiments are disclosed.

15 Claims, 8 Drawing Sheets

(51) Int. Cl.
*A41D 1/00* (2018.01)
*A43B 3/00* (2006.01)
*H05K 1/03* (2006.01)
*H05K 1/11* (2006.01)
*H05K 1/18* (2006.01)
*H05K 3/32* (2006.01)

(52) U.S. Cl.
CPC ......... *H05K 1/0313* (2013.01); *H05K 1/0393* (2013.01); *H05K 1/111* (2013.01); *H05K 1/186* (2013.01); *H05K 3/32* (2013.01); *H01L 2224/16225* (2013.01)

(58) Field of Classification Search
CPC .. H05K 1/0281; H05K 1/0283; H05K 1/0393; H05K 1/118; H05K 1/147; H05K 1/148; H05K 1/189; H05K 2201/042; H05K 2201/046; H05K 2201/05; H05K 1/0313; H05K 1/111; H05K 1/186; H05K 3/32; A41D 1/002; A43B 3/0005
See application file for complete search history.

(56) References Cited

U.S. PATENT DOCUMENTS

| | | |
|---|---|---|
| 2010/0002402 A1 | 1/2010 | Rogers et al. |
| 2012/0280399 A1 | 11/2012 | Daubenspeck et al. |
| 2014/0104793 A1* | 4/2014 | Park ..................... H05K 1/0283 361/749 |
| 2014/0209967 A1* | 7/2014 | Yu ........................ H05K 1/0373 257/99 |
| 2014/0240932 A1 | 8/2014 | Hsu |
| 2015/0099976 A1 | 4/2015 | Ghaffari et al. |
| 2017/0142839 A1* | 5/2017 | Aleksov ................. H05K 1/184 |

OTHER PUBLICATIONS

International Preliminary Report on Patentability for International Patent Application No. PCT/US2016/55801, dated Jun. 28, 2018-, 7 pages.

* cited by examiner

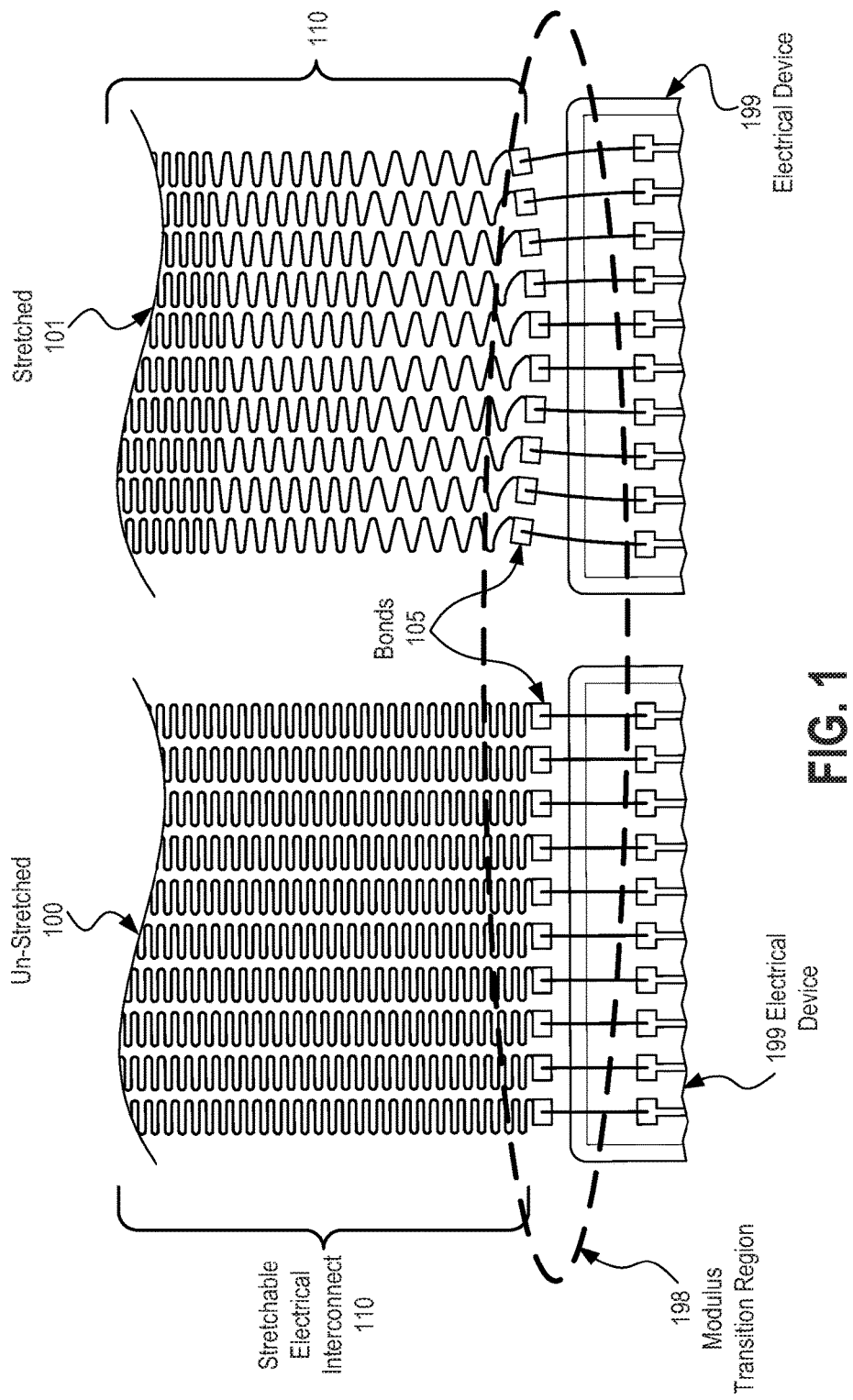

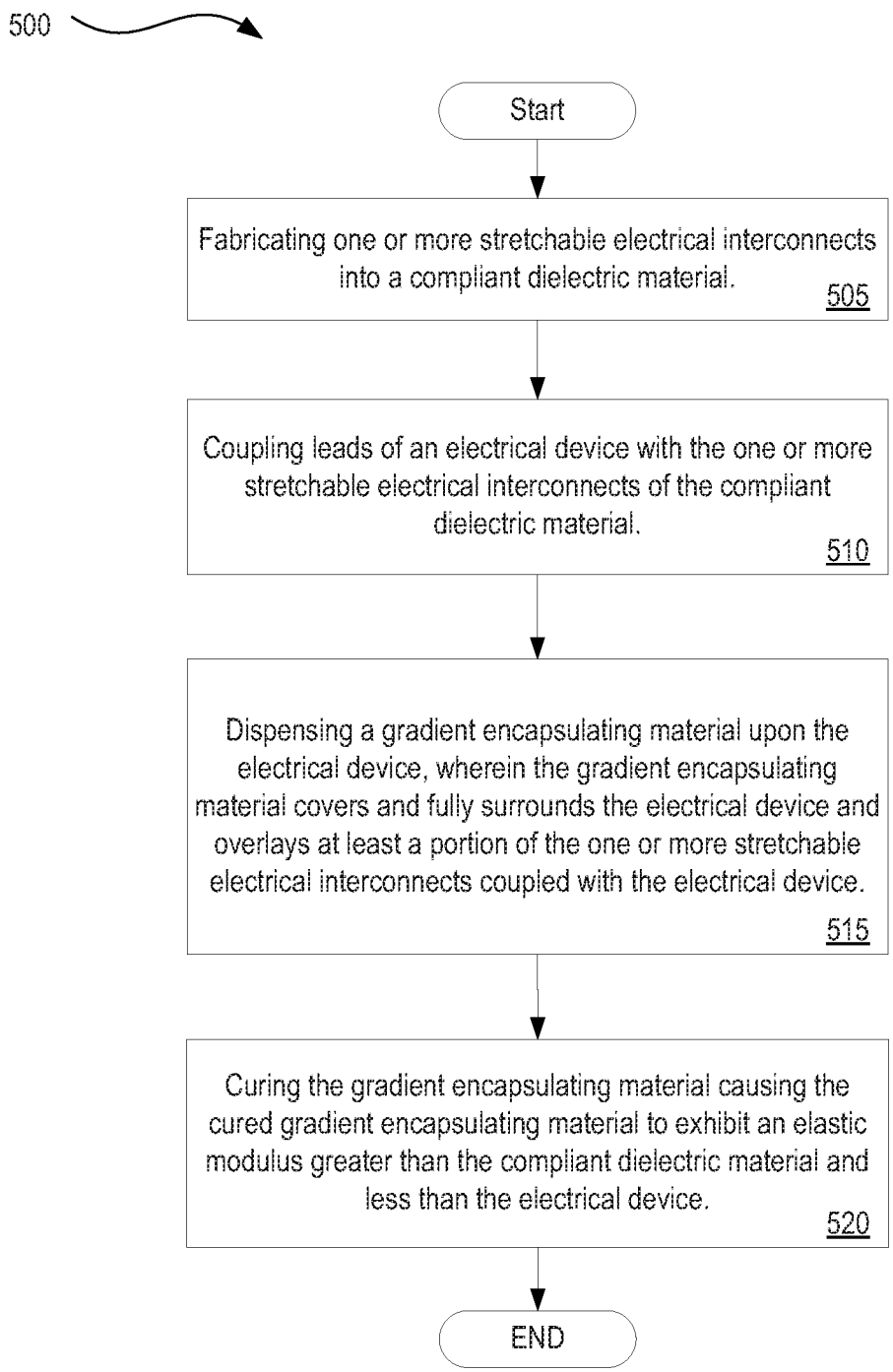

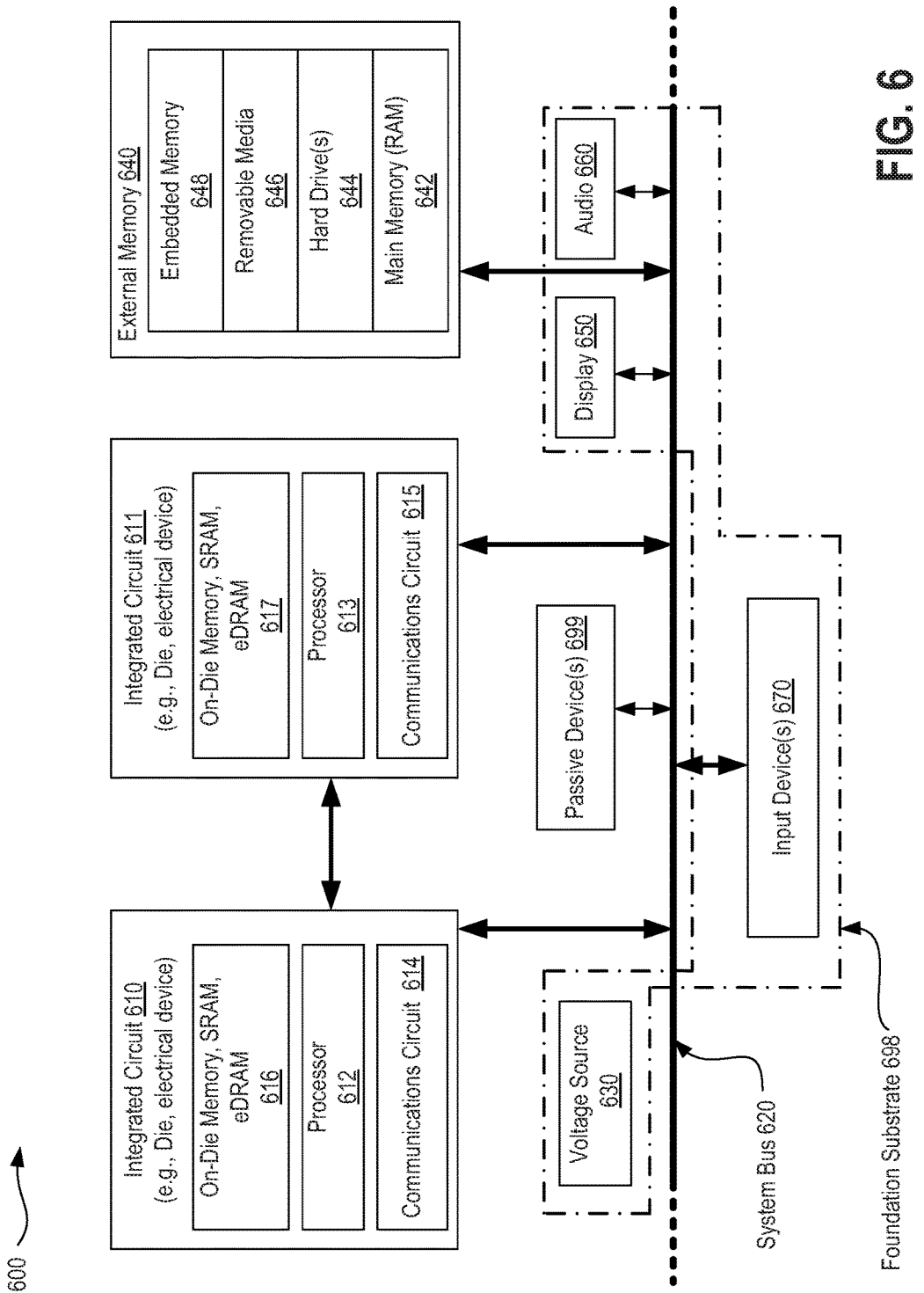

GRADIENT ENCAPSULANT PROTECTION OF DEVICES IN STRETCHABLE ELECTRONICS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to gradient encapsulant protection of devices in stretchable electronics.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

As modern electronics advance a variety of new use cases and implementations are entering the market place including the use of stretchable or flexible electronics for clothing and other wearable devices. This presents a serious problem for manufacturers of such electronics devices, clothing, and so called "wearables" given the simple fact that advanced electronics historically have been made to be ridged. "Wearables," "wearable technology," "fashionable technology," "wearable devices," "tech togs," and "fashion electronics" are all in reference to a class of clothing, garments, and accessories which incorporate computer and advanced electronics technologies into "wearable" pieces, be they clothing or otherwise. Wearable devices such as activity trackers represent a part of the "Internet of Things" as they form part of the network of physical objects or "things" embedded with electronics, software, sensors and connectivity to enable objects to exchange data with a manufacturer, operator and/or other connected devices, without requiring human intervention.

While such wearables commonly have an aesthetic aspect to them, we discuss the functional and technological aspects of wearables herein.

Fundamentally, when a very rigid material such as an electronic device is connected to or integrated within a stretchable material, be it fabric or some other non-ridged materials, the components and circuitry of the electronic device are subjected to stretching. The boundary between the stretchable area and the rigid area of such wearables may therefore break or tear, thus damaging the electronics or the fabric, or as is often the case, damaging both.

The present state of the art may therefore benefit from the gradient encapsulant protection of devices in stretchable electronics as is described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 1 depicts an un-stretched and a stretched example of a stretchable electrical interconnect in accordance with which embodiments may operate;

FIG. 5 is a flow diagram illustrating a method for implementing gradient encapsulant protection of devices in stretchable electronics in accordance with described embodiments; and FIG. 6 is a schematic of a computer system, in accordance with an embodiment of the present invention.

DETAILED DESCRIPTION

Figure 2A:
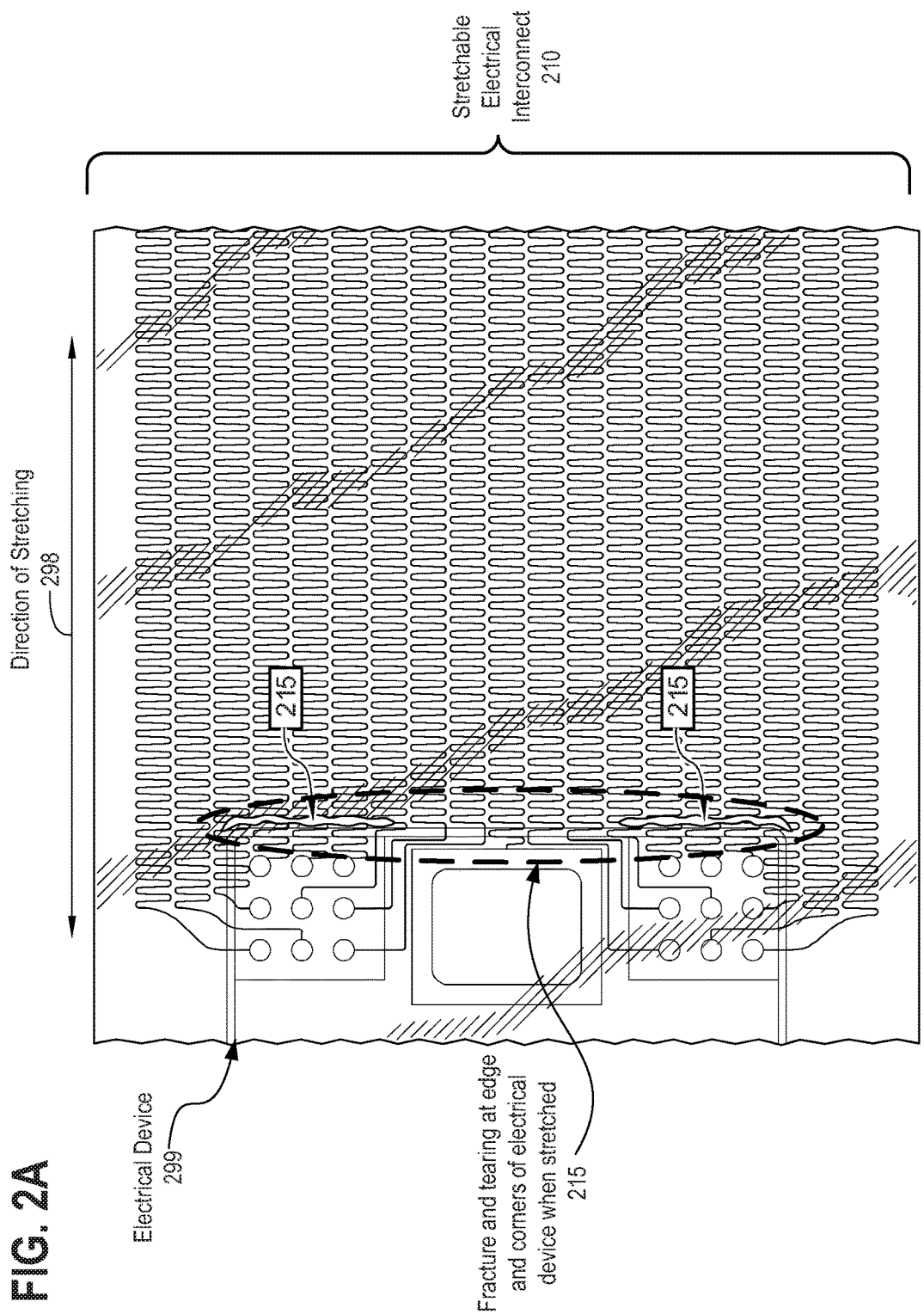
FIG. 2A illustrates another stretchable electrical interconnect in accordance with which embodiments may operate.

Described herein are systems, apparatuses, and methods for gradient encapsulant protection of devices in stretchable electronics. For instance, in accordance with one embodiment, there is an apparatus with an electrical device on a stretchable substrate; one or more stretchable electrical interconnects coupled with the electrical device; one or more electrical components electrically coupled with the electrical device via the one or more stretchable electrical interconnects; and a gradient encapsulating material layered over and fully surrounding the electrical device and at least a portion of the one or more stretchable electrical interconnects coupled thereto, in which the gradient encapsulating material has an elastic modulus greater than the stretchable substrate and in which the elastic modulus of the gradient encapsulating material is less than the electrical device.

In a related embodiment there is a wearable technology to be worn as a clothing item or an accessory, in which the wearable technology includes at least an integrated circuit on a stretchable substrate; one or more stretchable electrical interconnects coupled with the integrated circuit; one or more electrical components electrically coupled with the integrated circuit via the one or more stretchable electrical interconnects; and a gradient encapsulating material layered over and fully surrounding the integrated circuit and at least a portion of the one or more stretchable electrical interconnects coupled with the integrated circuit, in which the gradient encapsulating material has an elastic modulus greater than the stretchable substrate and further in which the elastic modulus of the gradient encapsulating material is less than the integrated circuit.

In accordance with such an embodiment, the wearable technology is embodied within one of: a clothing item; sports attire; a shoe; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

FIG. 1 depicts an un-stretched 100 and a stretched 101 example of a stretchable electrical interconnect 110 in accordance with which embodiments may operate.

In particular, there is depicted a stretchable electrical interconnect 110 in the un-stretched 100 form connected to an electrical device 199 via bonds 105 and further depicted is a stretchable electrical interconnect 110 in the stretched 101 form connected to an electrical device 199 via bonds 105.

The farther the stretchable electrical interconnects 110 are stretched between the rigid area at the electrical device 199 and the flexible area of the fabric, material, or other carrier which is integrated with the stretchable electrical interconnect 110, the greater the stress on the stretchable electrical interconnect 110 which in turn results in a high stress area which causes fracture or separation and loss of functionality to the electrical device 199 as a result of repeated stretching and unstretching of such components.

According to a particular embodiment, the stretchable electrical interconnect 110 is made up of curvy meandering copper wires between a die, such as the electrical device 199, and the fabric or other material upon which the stretchable electrical interconnect 110 is embodied. These meandering copper wires permit some movement and limited stretching, but when stretched repeatedly or stretched past a critical point, a high stress area nevertheless results which causes the fracturing and/or separation between the fabric and the electrical device.

In accordance with one embodiment, connecting stretchable/wearable electronics with a rigid material such as a silicon die (Si die), packaged components, multi component modules, etc.) necessitates the electronics be connected with stretchable interconnection metal traces on a stretchable substrate such as polydimethylsiloxane (PDMS) so that the entire product package is compliant (e.g., sufficiently flexible) so as to accommodate the high strain during cyclic stretching of the wearable electronics.

Polydimethylsiloxane (PDMS and also called dimethicone) belongs to a group of polymeric organosilicon compounds commonly referred to as silicones and is one of the most widely used silicon-based organic polymer in the marketplace today. PDMS commonly utilized due to its rheological flow properties.

Other stretchable substrates may be utilized accordance to preference, use case, and the particular application. For instance, in accordance with one embodiment, the stretchable substrate is one of a stretchable polydimethylsiloxane (PDMS) substrate, a stretchable Polyisoprene substrate, a stretchable polybutadiene substrate, a stretchable polyisobutylene substrate, a stretchable polyurethanes substrate, a stretchable thermoplasticpolyurethanes substrate, a stretchable butyl rubber substrate, a stretchable nitrile rubber substrate, or a stretchable woven fabric substrate.

Fundamentally, the cyclic stretching of stretchable electronics during normal use leads to a shortened useful life due to fracture of the interconnections between the rigid material upon which the electrical device resides and the metal traces and bonds, typically in the vicinity of the rigid material where a transition between the rigid material and a compliant stretchable material such as PDMS occurs.

This fracturing is attributable in large part to the sharp transition between the rigid material having a very high elastic modulus (e.g., it doesn't stretch or bend) and the naturally and purposefully compliant PDMS having a low modulus (e.g., the PDMS stretches and bends).

Cumulative strain damage over iterative cyclic stretching causes delamination and fracturing of the interconnections at this modulus transition region 198 as depicted. For instance, fracturing of the meandering traces was observed in the range of maximum stretching of approximately 46% with the area of fracture occurring most commonly at or near the bonds. Tearing was observed in the range of maximum stretching of approximately 34% with the tearing occurring most commonly at or near the corners of the electrical device.

Application of the described compliant/flexible gradient elastomer layer above and/or below the modulus transition region 198 so as to cover the die interconnection area between the ridged electrical device 199 and the non-ridged PDMS provides for a smooth transition between the die, the die interconnections, and the stretchable material (PDMS).

According to described embodiments, the material of the gradient elastomer is such that its modulus (defined as E) is between the modulus of the die and the stretchable PDMS material resulting in $E_{(Si)} > E_{(gradient\ elastomer)} > E_{(PDMS)}$. Thus, according to described embodiments, the electrical device 199 has a highest modulus, the gradient elastomer has a modulus less than the electrical device 199 but greater than the stretchable PDMS material, and the PDMS material has the lowest modulus, less than both the electrical device 199 and less than the gradient elastomer. In such a way, the gradient elastomer forms a modulus transition region 198 between the electrical device 199 (e.g., the die) and the stretchable PDMS material to inhibit fracture, tearing, delamination and other failure modes of interconnects between the stretchable electrical interconnect 110 and the electrical device.

FIG. 2A illustrates another stretchable electrical interconnect 210 in accordance with which embodiments may operate. Further depicted is electrical device 299. The direction of stretching 298 depicts the ability of the meandering copper wires of the stretchable electrical interconnect 210 to stretch and un-stretch in the direction shown, however, fracture and tearing at the edges and corners of the electrical device may nevertheless occur when stretched as is depicted by element 215.

Here, the electrical device 299 shown and the stretchable electrical interconnect 210 is integrated with a stretchable fabric and the meandering copper wires work in conjunction with the stretchable fabric to provide some movement while permitting the electrical device 299 to maintain its function and interconnect with the stretchable electrical interconnect. However, the problem remains insomuch that the repeated stretching fatigues the wires leading to failure as well as the critical limit to which the wires may permissibly be stretched is not enforced by such a stretchable fabric, and thus, tears and fractures remain a problem. The area of highest strain tends to be nearest the electrical device 299 and thus, the stretchable electrical interconnect 210 is likely to fracture or the fabric is likely to tear at that area closest to the electrical device 299.

In accordance with one embodiment the stretchable electrical interconnect 210 has a three-dimensional form, for instance, as a spiral or spring. In other embodiments, the stretchable electrical interconnect 210 has a substantially two-dimensional form meandering back and forth on a single plane, for instance, upon the same plane of the electrical device 299 to which the stretchable electrical interconnect 210 connects.

Fracture and tearing of a stretchable material (PDMS) was observed to be most common along the electrical device 299 module corners and edges during stretch test. Application of the compliant/flexible gradient elastomeric material above the die or electrical device 299 module and interconnection regions was observed to provide a smooth transition between the die and stretchable material to inhibit fracture and tearing.

In accordance with one embodiment where modulus E of the gradient elastomer is $E_{(Si)} > E_{(gradient\ elastomer)} > E_{(PDMS)}$ the modulus of the die or electrical device 299 module was observed to be $E_{(Si)}$=130-185 GPa and further in which the modulus of the stretchable material was observed to be $E_{(PDMS)}$=0.6-3.7 MPa such that $E_{(gradient\ elastomer)}$ was greater than $E_{(PDMS)}$ and less than $E_{(Si)}$.

Figure 2B:
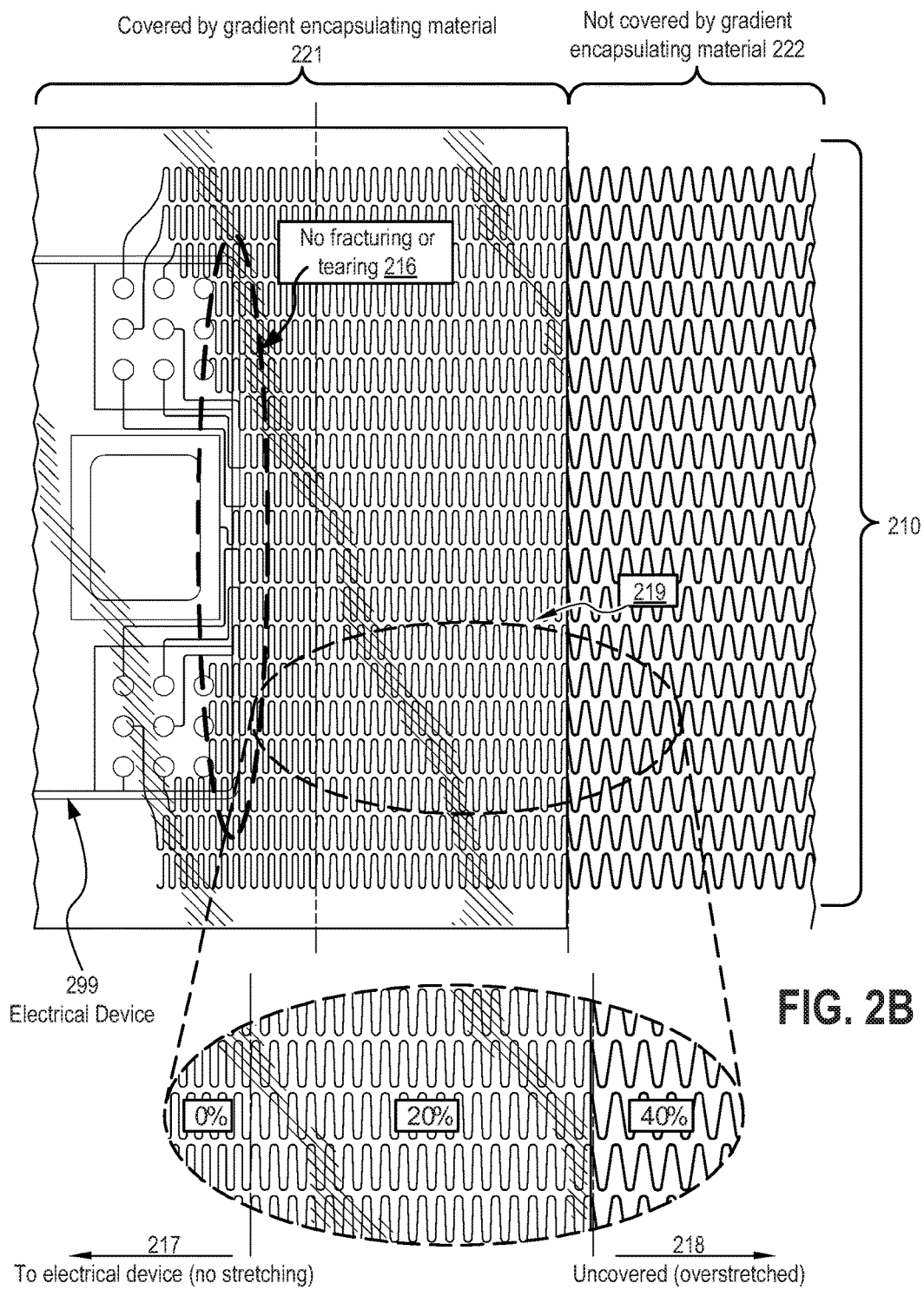
FIG. 2B illustrates yet another stretchable electrical interconnect in accordance with which embodiments may operate.

FIG. 2B illustrates yet another stretchable electrical interconnect 210 in accordance with which embodiments may operate. As depicted, the electrical device 299 shown and the stretchable electrical interconnect 210 are integrated with a stretchable fabric which in conjunction with the meandering copper wires allow some stretching.

In this particular embodiment, the leftmost approximately two-thirds of the stretchable electrical interconnect 210 electrical device 299 are covered by a gradient encapsulating material as indicated by element 221 whereas the remaining rightmost approximately one-third of the stretchable electrical interconnect 210 is not covered by the gradient encapsulating material as indicated by element 222.

As can be seen from the depiction provided, there is no fracturing or tearing 216 at or near the electrical device 299 where the stretchable electrical interconnect 210 connects with the electrical device 299. This result is representative of actual lab testing and lab results observed for an electrical device 299 and stretchable electrical interconnect 210 when covered by gradient encapsulating material 221.

The blowout depicted by element 219 depicts varying amounts of stretching in which the stretchable electrical interconnect 210 experiences little to no stretching (e.g., 0% stretched as indicated by element 217) in the direction of the electrical device. This left most portion is covered by gradient encapsulating material as indicated by element 221. The middle portion of the stretchable electrical interconnect 210 experiences limited but acceptable stretching (e.g., 20% as indicated in the depiction). This center portion of the blowout depicted at element 219 is also covered by gradient encapsulating material as indicated by element 221.

The right most portion of the stretchable electrical interconnect 210 as depicted by the blowout (element 219) is not covered by gradient encapsulating material as indicated by element 222. Consequently, the stretchable electrical interconnect 210 being uncovered is thus overstretched as indicated by element 218 which will result in immediate or premature failure.

In accordance with one embodiment of the invention, there are multiple such electrical devices 299 each of which are connected with or interconnected through one or more stretchable electrical interconnects 210. Such a structure may be referred to as a "sea of islands" or simply islands given that multiple such electrical devices 299 are present. Such an approach increases the useful life of the stretchable electrical interconnects 210 when not covered by the gradient encapsulating material but greatly improves the useful life of the stretchable electrical interconnects 210 when the electrical devices and the stretchable electrical interconnects 210 between them are covered by the gradient encapsulating material.

In such a way, the mismatch between the rigid body of the electrical device(s) 299 and a flexible body, such as fabric, etc., is accommodated by bifurcating the rigid body of the electrical device 299 into multiple, smaller pieces, each a smaller subset of the of rigid body of the original electrical device 299 to form the multiple islands and provide greater stretchability.

The sea of islands approach is appropriate for simple electrical devices and sensors, however, the approach is less suitable for more complex electrical devices as the limited space on any given "island" as well as the division of a complex electrical device into multiple such islands mandates that each individual island be relegated to simplistic functionality or suffer from greater latency and communication distances between the various islands, even when hardwired through the stretchable electrical interconnects 210 covered by the gradient encapsulating material, and requires the breaking up of complex circuitry into multiple less sophisticated electrical components.

Consider for instance the distinction between simple electrical devices such as sensors (e.g., accelerometers, gyroscopic sensors, pressure and temperature sensors, etc.) which tend to be very small compared with more complex but arguably still simple electrical devices (e.g., a cellular or Bluetooth transceiver) which may be slightly larger versus that of a complex electrical device such as a microprocessor which is larger still. The various sensors and transceivers may be appropriate for bifurcating from a primary board carrying such a microprocessor, however, the functionality provided by the microprocessor cannot feasibly or economically be bifurcated, and thus, there is a limit to the sea of islands approach, despite its benefits.

Therefore, in certain embodiments, a single electrical device which is larger but capable of integrating more complex circuitry and components is provided which is then connected with one or more sensors via the stretchable electrical interconnects 210 and in which both the stretchable electrical interconnects 210 and the single more complex electrical device 299 are covered by the gradient encapsulating material.

The two diverse concepts of a single complex electrical device and the sea of islands formed by the multiple simplistic devices establish a range or continuum which remains compatible with the teachings set forth herein such that any quantity from one to many electrical devices 299 connected with one or more interconnects may be utilized in accordance with the described embodiments so long as the devices and interconnects are covered by the gradient encapsulating material as discussed herein.

For instance, in accordance with another embodiment, there may be one such "island" such as a microprocessors which is connected with other islands and sensors via the stretchable electrical interconnects 210 in which the other electrical devices forming such islands are selected from system and package components that consists of other microprocessors, analog chips, digital circuits, RF (Radio Frequency) components, memory components, etc.

In a particular embodiment, there is a System on a Chip (SOC) configuration integrated into a fabric or other stretchable material upon which the SOC having electronic device circuitry is covered by the gradient encapsulating material.

As described herein, the gradient encapsulating material provides a gradation of mechanical properties of the materials which are present between the rigid body of the electrical device 299 and a flexible body upon which the electrical device 299 is integrated, such as a fabric or other stretchable material making up, for instance, a garment or other wearable.

According to one embodiment, such a gradient encapsulating material, also referred to as an elastomeric material or a flexible material, is impregnated with a more rigid material to increase its rigidity or stated differently, to alter its modulus. The "modulus" of the gradient encapsulating material, also referred to the modulus of elasticity, is a measure an object or substance's resistance to being deformed elastically (i.e., non-permanently) when a force is applied to it. Here, the modulus of the gradient encapsulating material or modulus, is therefore in reference to the ability of the gradient encapsulating material to resist at least stretching and to therefore retain its form and shape against a pulling force, such as the force which occurs when stretchable fabric is pulled or stretched by a wearer. In accordance with a particular embodiment, the elastic modulus of the gradient encapsulating material is defined as the slope of its stress-strain curve in the elastic deformation region. Therefore, a stiffer variant of the gradient encapsulating material will have a higher elastic modulus and therefore be more resistant to deformation by pulling or stretching whereas a variant of the gradient encapsulating material with a lower elastic modulus will stretch and pull more easily or with a lesser force or will deform to a greater degree than the stiffer variant when exposed to a same force.

In accordance with a particular embodiment, the elastic modulus of the gradient encapsulating material is proportional to a stress applied to the gradient encapsulating material acting as a deformation force upon the gradient encapsulating material, in which the elastic modulus is defined as the stress force applied divided by the area of the gradient encapsulating material to which the force is applied and further in which a strain upon the gradient encapsulating material is defined as the ratio of the change in length of the gradient encapsulating material in the direction of stretching 298 as caused by the deformation to the un-stretched length of the gradient encapsulating material.

Figure 3:
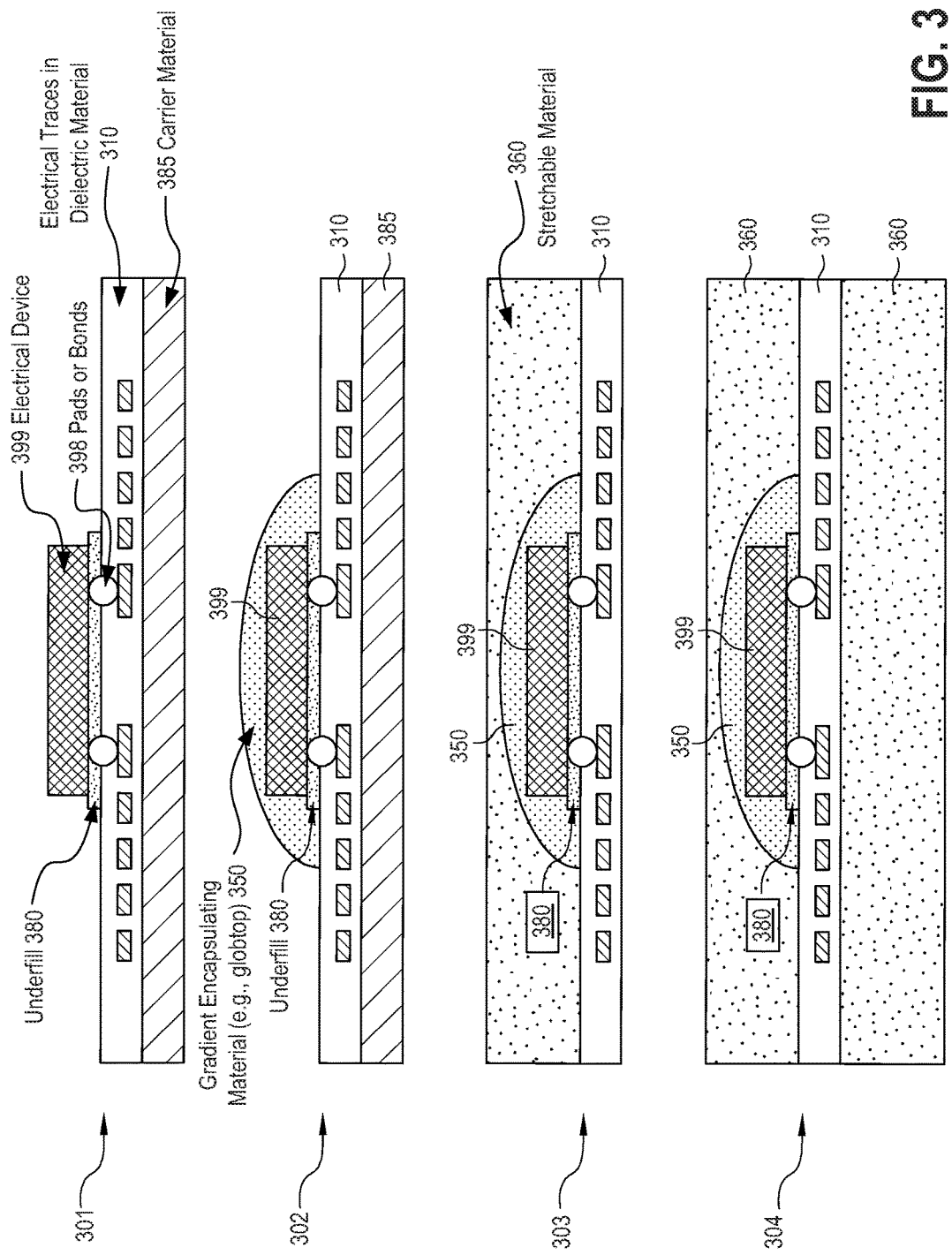
FIG. 3 illustrates gradient encapsulating material being applied to a stretchable material in accordance with disclosed embodiments.

FIG. 3 illustrates gradient encapsulating material 350 being applied to a stretchable material 360 in accordance with disclosed embodiments.

In accordance with particular embodiments, the gradient elastomer material is applied onto a die after chip interconnection with the stretchable substrate forming a gradient encapsulating material over at least the die (e.g., electrical device 199, 299, 399) and at least a portion of the stretchable electrical interconnect 110 attached to the die.

In accordance with one embodiment, a gradient elastomer material is applied on the die after chip interconnection to the stretchable substrate followed by application of the stretchable material (PDMS) over the gradient elastomer material. High Volume Manufacturing (HVM) processes permit the gradient elastomer to be applied over the die/module by a rapid dispense method such as an inkjet enabling the gradient elastomer to be dispensed over multiple units simultaneously at the panel level followed by elastomer cure at the panel level. Such a process results a hemispherical or ellipsoid appearance of the gradient elastomer. Further panel processes with the stretchable material may then follow.

More particularly, there is depicted a process of application of the gradient elastomeric material in accordance with one embodiment. As depicted, at block 301, the die or electrical device 399 is attached to pads or bonds 398 connected to electrical traces fabricated onto a dielectric material (310). Underfill 380 material is dispensed under the die or electrical device 399 and the layers rest upon a carrier material 385 as shown.

The process of application of the gradient elastomeric continues at block 302 with the gradient elastomer material being dispensed over the die or electrical device 399 forming a gradient encapsulating material 350 over the electrical device 399 and underfill 380 (referred to also as a "globtop" which encompasses both the electrical device 399 and underfill 380 as shown). The electrical traces in the dielectric material 310 and the carrier material 385 remain.

The process of application of the gradient elastomeric continues at block 303 in which the stretchable material 360 (such as PDMS) is dispensed or laminated over the entire unit or panel on the side of the die or electrical device 399 and cured and then the carrier material 385 is removed. The stretchable material 360 thus encompasses the gradient encapsulating material 350 which remains and encompasses the electrical device 399 which rests upon the underfill 380 which remains which is atop the electrical traces in the dielectric material 310 layer. At block 303 it may be observed that the carrier material 385 has been removed.

In accordance with a particular embodiment, the PDMS or stretchable material is dispensed and laminated over an entire unit panel on a die/electrical device side and then cured, subsequent to which the carrier material 385 is removed. In such an embodiment, the carrier material constitutes a rigid material used during the manufacturing process which does not ultimately form part of the wearable or consumer product being manufactured. For instance, the carrier material 385 may be a piece of stainless steel, glass, copper, or some other rigid material capable of receiving the application of the manufactured layer's (e.g., the dielectric material and electrical traces, the pads/bonds, the underfill, the electrical device), and ultimately the gradient encapsulating material to cover the electrical device and the stretchable material/PDMS. In certain embodiments, many units are manufactured simultaneously on a single large carrier plate or panel constituting the carrier material.

The process of application of the gradient elastomeric continues at block 304 which is optional. At block 304, the stretchable material 360 is applied, dispensed, or laminated over the entire unit or panel on the bottom side, the side away from the die or the electrical device 399, and the stretchable material 360 is then cured.

In such a way, the gradient elastomer over the die/module provides a smooth transition to the stretchable material without inducing high stress concentration areas when the wearable is under strain, as such high stress concentration areas have been observed to initiate cracks leading to early life failure.

Experiments show that when under strain, a stretchable material, such as the PDMS described, having an electrical device integrated thereupon and covered by the gradient encapsulating material withstands stretching in excess of 40% without fracturing, delamination, cracking, or tearing. Gradual elongation of the traces is evident farther away from the die module where the gradient elastomer thins down with lesser elongation of the traces nearer the die module and minimal or no elongation of the traces where the traces connect to the die module through the bonds.

Figure 4A:
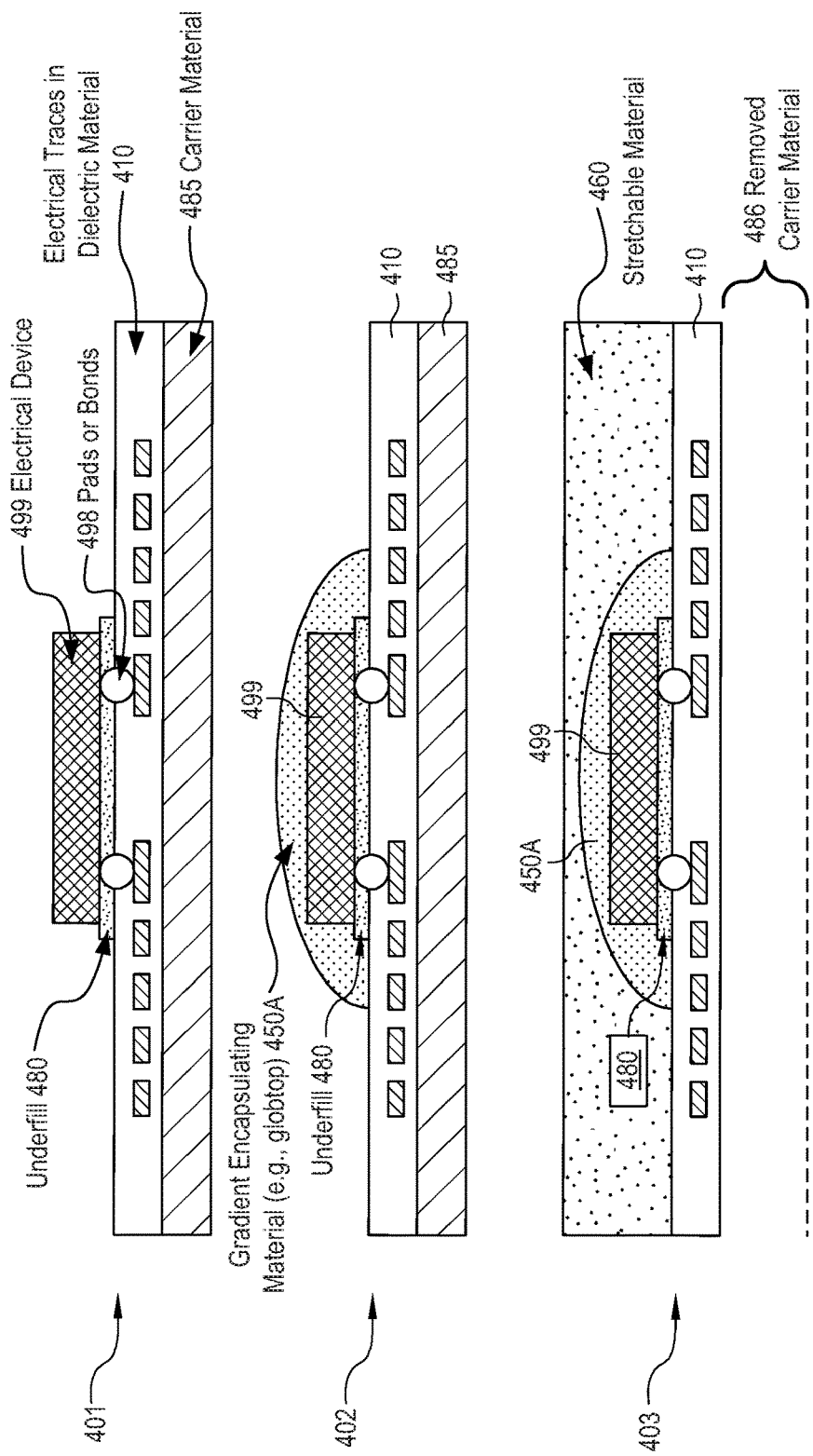
FIGS. 4A and 4B illustrate an alternative embodiment of a gradient encapsulating material being applied to a stretchable material on a die side and opposite a die side in accordance with disclosed embodiments.
Figure 4B:
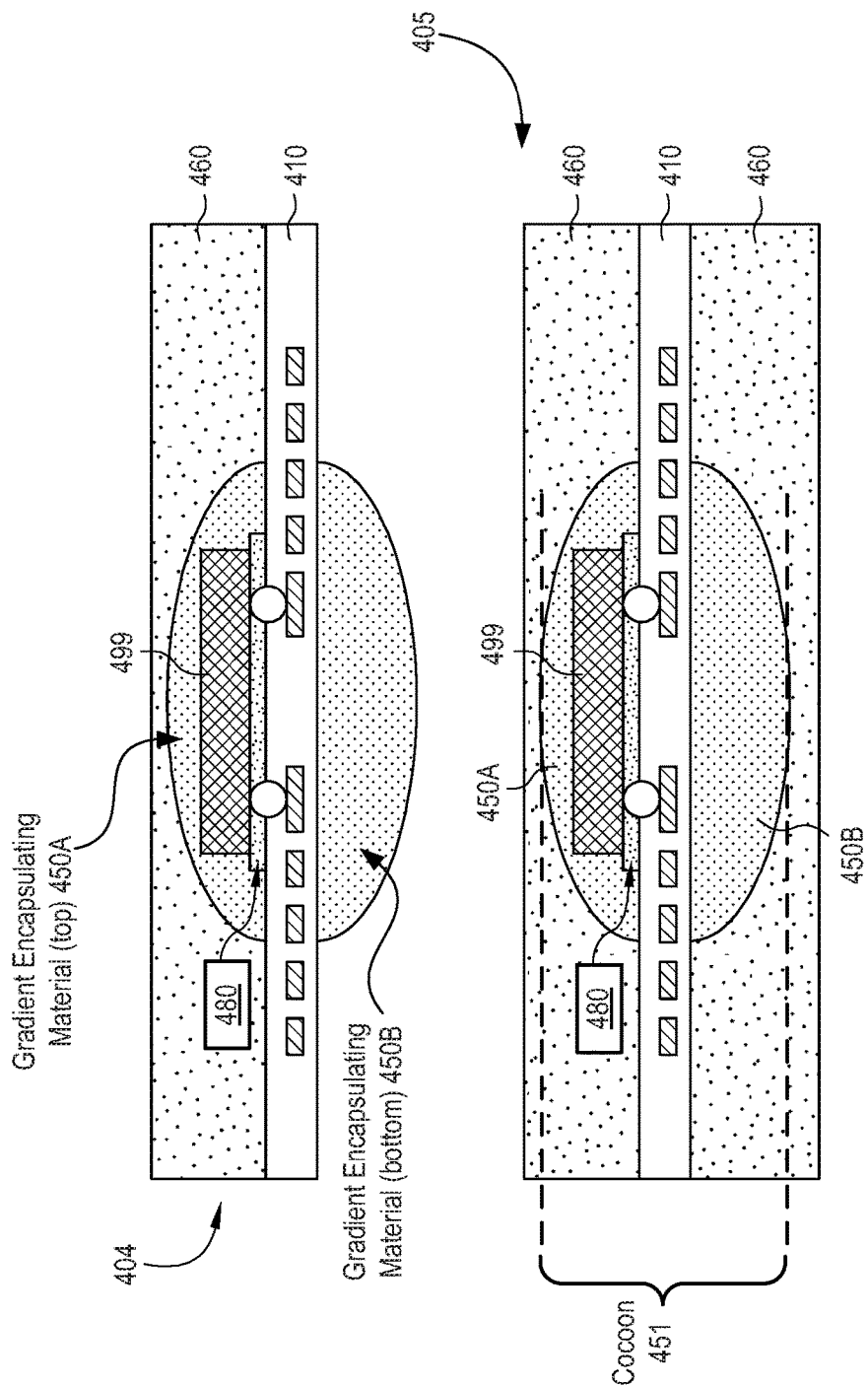

FIGS. 4A and 4B illustrate an alternative embodiment of a gradient encapsulating material being applied to a stretchable material on a die side and opposite a die side in accordance with disclosed embodiments.

At FIG. 4A, elements 401, 402, and 403 correspond to elements 301, 301, and 303 respectively at FIG. 3. Specifically, at block 401, electrical device 499 is attached to pads or bonds 498 connected with electrical traces fabricated onto a dielectric material 410; underfill 480 material is dispensed under electrical device 499 and the layers rest upon a carrier material 485. Block 402 continues with gradient elastomer material being dispensed over electrical device 499 forming gradient encapsulating material (top) 450A over electrical device 499. At block 403 stretchable material 460 is dispensed over the electrical device 499 and cured and carrier material 485 is removed (e.g., element 486 depicts the removed carrier material).

The process of application of the gradient elastomeric continues at block 404 of FIG. 4 which diverges from block 304 of FIG. 3. Specifically, the gradient encapsulating material (bottom) 450B is dispensed onto the bottom side of the unit or panel in area of the die or electrical device 499 and opposite to the die or electrical device 499 and cured.

The process of application of the gradient elastomeric continues at block 405 in which the stretchable material 460 (such as PDMS) is dispensed or laminated over the entire unit or panel on the bottom side opposite to the die or electrical device 399 and cured. In such a way, the gradient encapsulating material dispensed and cured upon the top and bottom (elements 450A and 450B) form a cocoon 451 around the die or electrical device 499 and at least a portion of the electrical traces in the dielectric material 410, the cocoon being surrounded top and bottom by the double sided stretchable material 460 (such as PDMS) dispensed and cured on the top side at block 404 and dispensed and cured on the bottom side at block 405.

Dispensing and curing the stretchable material 460 to both the top and the bottom of the substrate provides a smoother transition in modulus between the die or electrical device 499 area and the areas of the stretchable material which are separate from the die or electrical device 499 and not covered by the top and bottom gradient encapsulating material 450A-B and the areas immediately adjacent to the die or electrical device 499 which are covered by the top and bottom gradient encapsulating material 450A-B within the cured layers of the stretchable material 460.

In accordance with one embodiment, the resulting ellipsoid shaped cocoon 451 of the top and bottom gradient encapsulating material 450A-B formed from the dispensed and cured elastomer material significantly reduces high stress concentration points from which cracks can initiate thus providing demonstrably longer useful life.

In accordance with one embodiment, the gradient encapsulating material is formed with a mix of particles which will respond to stimuli and the gradient encapsulating material is applied over the die/electrical device 499 and then the stimuli is applied to the gradient encapsulating material causing the particles within the gradient encapsulating material to move, migrate, shift, aggregate, segregate, or settle. For instance, the modulus of the gradient encapsulating material may be established with a greater or a lesser degree of rigidity at or near the die/electrical device 499 and a lesser degree of rigidity away from the die/electrical device 499 with the change in modulus shifting in a linear or non-linear fashion with distance from the die/electrical device depending on the mix of particles and the stimuli applied and the manner in which the stimuli is applied. In accordance with such an embodiment, the gradient encapsulating material is cured subsequent to the stimuli being applied. In an alternative embodiment, the gradient encapsulating material is cured concurrently with the stimuli being applied.

In accordance with a particular embodiment, the gradient elastomer is fabricated with a gradation of filler particles such that its effective modulus reduces from the die region to the stretchable material region. For instance, in one embodiment, a gradient encapsulating material is formed from the gradient elastomer from a mix of high modulus filler material such as $SiO_2$ (e.g., Silicon dioxide, silica) particles with the elastomer material, subsequent to which the elastomer mixture is dispensed over the die and allowed to segregate at least partially over the die during the elastomer cure process. More particularly, the $SiO_2$ particles are permitted to settle or segregate at least partially to the bottom of the elastomer material in accordance with such an embodiment. In alternative embodiments, the $SiO_2$ particles are retained and dispersed more evenly throughout the mix of elastomer material by way of a faster cure process.

In accordance with another embodiment, charged filler particles are intermixed through the elastomer mixture forming the gradient encapsulating material 450A-B. In such an embodiment, the charged filler particles are then caused to segregate by application of an electrical field at or near the deposited gradient encapsulating material 450A-B at blocks 402 and 404 (and also block 302 of FIG. 3) prior to the curing process of the deposited gradient encapsulating material 450A-B.

In accordance with another embodiment, magnetic particles such as FeO (e.g., Iron(II) oxide, ferrous oxide) are intermixed through the elastomer mixture forming the gradient encapsulating material 450A-B rather than $SiO_2$ or charged particles. In such an embodiment, the magnetic particles are then caused to segregate by application of a magnetic field at or near the deposited gradient encapsulating material 450A-B at blocks 402 and 404 (an also block 302 of FIG. 3) prior to the curing process of the deposited gradient encapsulating material 450A-B.

In accordance with one embodiment, the elastomer mixture forming the gradient encapsulating material 450A-B having either the magnetic or charged particles intermixed therein is treated to an electrical field or a magnetic field which is strongest near the die or electrical device 499 and weakest away from the die or electrical device 499 such that the magnetic or charged particles accumulate more nearest the die or electrical device 499 and accumulate to a lesser extent farther away from the die or electrical device 499. Consequently, the resulting gradient encapsulating material 450A-B once cured will have modulus properties that vary in proportion to a distance to or from the die or electrical device 499. More particularly, the encapsulating material 450A-B once cured will be less flexible (e.g., more ridged with a higher modulus) nearest the die or electrical device 499 and will be more compliant (e.g., more flexible and less rigid with a lower modulus) farthest from the die or electrical device 499 with the measure of elastic modulus varying in proportion to a distance from the die or electrical device 499 where the electrical field or magnetic field was applied prior to curing.

Experiments show that segregation of charged $SiO_2$ filler particles in epoxy material occur when exposed to an electrical field. Experiments further show segregation of magnetic particles to the die surface when exposed to a magnetic field. In a magnetic model simulation, magnetic particles (100/0 FeO), size (1 to 10 microns in diameter) move or segregate (10 to 20 secs) in a viscous medium (viscosity=1 to 100 centipoise) under the application of a magnetic field (0.1 Tesla) from a permanent magnet placed 4 to 10 mm from the magnetic particles.

In such a way the gradient elastomer can is fabricated such that its effective modulus reduces from the die region to the stretchable material region in a substantially linear progression or in a non-linear progression as desired utilizing the above described approaches.

In accordance with an alternative embodiment, the gradient encapsulating material is applied over the die/electrical device 499 as a first layer having a first modulus and a second layer of the gradient encapsulating material is applied over the die/electrical device 499 and the first layer, in which the second layer has a modulus different than the modulus of the first layer (e.g., either a higher or a lower modulus). In such an embodiment, the first and second layers may be cured concurrently or serially.

In such a way the gradation, or change in modulus, is customizable in not just an XY plane, but also in a Z direction. For instance, through the layering of the gradient encapsulating material applied over the die/electrical device 499 with differing modulus for each layer, the resulting product, once cured, may have a modulus which changes with distance from the die/electrical device 499 and which changes with height or distance in the Z direction from the die/electrical device 499. Any number of layers may be utilized to form the desired thickness and region of modulus transition as appropriate for the product being manufactured. For instance, it may be appropriate to cover bonds or flip chip interconnects with differing modulus layers based on the type of interconnect or based on their height, etc.

In accordance with one embodiment, the gradient elastomer material is formulated so as to have strong adhesion to the die/electrical device 499 and the PDMS or other utilized fabric or stretchable material which forms the wearable and within which the electrical device covered by or cocooned within the gradient encapsulating material is integrated.

In accordance with one embodiment, the sea of islands concept described above is utilized to interconnect multiple dies upon a single substrate or within a single wearable having multiple electrical devices interconnected via one or more stretchable electrical interconnects. However, embodiments are not limited to the sea of islands approach and a single die or electrical device may be utilized with larger, more sophisticated and complex circuitry in which the larger die or electrical device is covered by the gradient encapsulating material or cocooned by such gradient encapsulating material 450A-B.

In accordance with one embodiment, leads of the die or electrical device 499 are connected with or to the stretchable electrical interconnects or to wired leads or to electrical traces integrated into dielectric material via bonds, taps, or flip chip interconnects. Other connection means are similarly feasible.

FIG. 5 is a flow diagram illustrating a method 500 for implementing gradient encapsulant protection of devices in stretchable electronics in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 500 may be utilized in a variety of combinations.

At block 505 the method includes fabricating one or more stretchable electrical interconnects into a compliant dielectric material.

At block 510 the method includes coupling leads of an electrical device with the one or more stretchable electrical interconnects of the compliant dielectric material.

At block 515 the method includes dispensing a gradient encapsulating material upon the electrical device, in which the gradient encapsulating material covers and fully surrounds the electrical device and overlays at least a portion of the one or more stretchable electrical interconnects coupled with the electrical device.

At block 520 the method includes curing the gradient encapsulating material causing the cured gradient encapsulating material to exhibit an elastic modulus greater than the compliant dielectric material and less than the electrical device.

In accordance with another embodiment of method 500, dispensing the gradient encapsulating material upon the electrical device includes dispensing an uncured gradient elastomer upon the electrical device via an ink jet.

In accordance with another embodiment of method 500, dispensing the gradient encapsulating material upon the electrical device includes dispensing an uncured gradient elastomer including a mix of elastomer and $SiO_2$ (Silicon dioxide) particles which respond to electrical stimuli; and in which the method further includes applying an electrical stimuli to the gradient encapsulating material prior to or during the curing of the gradient encapsulating material, in which the electrical stimuli causes the $SiO_2$ particles to aggregate more densely nearer the electrical device creating a higher modulus of the gradient encapsulating material nearer the electrical device and to aggregate less densely farther from the electrical device creating a lower modulus of the gradient encapsulating material farther from the electrical device.

In accordance with another embodiment of method 500, dispensing the gradient encapsulating material upon the electrical device includes dispensing an uncured gradient elastomer including a mix of elastomer and FeO (ferrous oxide) particles which respond to stimuli of a magnetic field; and in which the method further includes applying the magnetic field to the gradient encapsulating material prior to or during the curing of the gradient encapsulating material, in which the magnetic field causes the FeO particles to aggregate more densely nearer the electrical device creating a higher modulus of the gradient encapsulating material nearer the electrical device and to aggregate less densely farther from the electrical device creating a lower modulus of the gradient encapsulating material farther from the electrical device.

In accordance with another embodiment of method 500, dispensing the gradient encapsulating material upon the electrical device forms a first layer which covers and fully surrounds the electrical device; in which the method further includes forming a second layer which covers and fully surrounds the electrical device and overlays at least a portion of the one or more stretchable electrical interconnects coupled with the electrical device by dispensing a second gradient encapsulating material upon the electrical device; in which the first layer of the gradient encapsulating material corresponds to a first modulus, the first modulus of the first layer being greater than the compliant dielectric material and less than the electrical device; and in which the second layer of the gradient encapsulating material corresponds to a second modulus, the second modulus being greater than the compliant dielectric material and less than the electrical device and different than the first modulus of the first layer.

In accordance with another embodiment of method 500, curing the gradient encapsulating material includes curing the first and second layers of the gradient encapsulating material concurrently or serially.

In accordance with another embodiment of method 500, the compliant dielectric material forms a stretchable substrate; in which the stretchable substrate includes a stretchable polydimethylsiloxane (PDMS) substrate or a stretchable woven fabric substrate.

In accordance with another embodiment of method 500, the process further includes electrically coupling one or more electrical components with the electrical device via the one or more stretchable electrical interconnects; in which the stretchable electrical interconnects provide an electrical and communications interface between the electrical device and the one or more electrical components through the dielectric material.

In accordance with another embodiment of method 500, the electrical device includes an integrated circuit and in which the one or more electrical components electrically coupled with the electrical device include any one of: a battery, a sensor, a transceiver, and a system on a chip (SOC).

In accordance with another embodiment of method 500, the electrical device includes a module package including at least a microelectronic die embedded in a processor and a memory and one or more communication circuits.

FIG. 6 is a schematic of a computer system 600, in accordance with an embodiment of the present invention. The computer system 600 (also referred to as the electronic system 600) as depicted can embody gradient encapsulant protection of devices in stretchable electronics, according to any of the several disclosed embodiments and their equivalents as set forth in this disclosure. The computer system 600 may be a mobile device such as a net-book computer. The computer system 600 may be a mobile device such as a wireless smart phone or tablet. The computer system 600 may be a desktop computer. The computer system 600 may be a hand-held reader. The computer system 600 may be a server system. The computer system 600 may be a supercomputer or high-performance computing system.

In accordance with one embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

Such an integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes, or is coupled with, electrical devices having gradient encapsulant protection, as disclosed herein.

In accordance with one embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In accordance with one embodiment, the integrated circuit 610 is complemented with a subsequent integrated circuit 611. Useful embodiments include a dual processor 613 and a dual communications circuit 615 and dual on-die memory 617 such as SRAM. In accordance with one embodiment, the dual integrated circuit 610 includes embedded on-die memory 617 such as eDRAM.

In one embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a die stack, according to an embodiment.

In accordance with one embodiment, the electronic system 600 also includes a display device 650 and an audio output 660. In one embodiment, the electronic system 600 includes an input device 670 such as a controller that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a package substrate having gradient encapsulant protection of devices in stretchable electronics, according to any of the several disclosed embodiments and their equivalents, an electronic system, a computer system, one or more methods of fabricating an integrated circuit, and one or more methods of fabricating an electronic assembly that includes a package substrate having gradient encapsulant protection of devices in stretchable electronics, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having gradient encapsulant protection of devices in stretchable electronics embodiments and their equivalents. A foundation substrate 698 may be included, as represented by the dashed line of FIG. 6. Passive devices 699 may also be included, as is also depicted in FIG. 6.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

What is claimed is:

1. An apparatus comprising:
   an electrical device on a stretchable substrate;
   one or more stretchable electrical interconnects coupled with the electrical device;
   one or more electrical components electrically coupled with the electrical device via the one or more stretchable electrical interconnects; and
   a gradient encapsulating material layered over and fully surrounding the electrical device and at least a portion of the one or more stretchable electrical interconnects coupled thereto, wherein the gradient encapsulating material has an elastic modulus greater than the stretchable substrate and wherein the elastic modulus of the gradient encapsulating material is less than the electrical device, and wherein the gradient encapsulating material has a first elastic modulus proximate the electrical device and a second elastic modulus proximate the stretchable substrate, the second elastic modulus lower than the first elastic modulus.

2. The apparatus of claim 1:
   wherein the gradient encapsulating material layered over and fully surrounding the electrical device is a mix of an elastomer with high modulus filler particles to form a gradient elastomer layered over and fully surrounding the electrical device; and
   wherein the gradient elastomer is fabricated with a gradation of the high modulus filler particles distributed non-uniformly through the gradient encapsulating material forming a modulus of the gradient encapsulating material which reduces with increasing distance from the electrical device.

3. The apparatus of claim 1:
   wherein the gradient encapsulating material layered over and fully surrounding the electrical device is a mix of an elastomer with $SiO_2$ (Silicon dioxide) particles which respond to electrical stimuli; and wherein an electrical stimuli applied to the gradient encapsulating material prior to or during a curing process of the gradient encapsulating material causes the $SiO_2$ particles to aggregate more densely nearer the electrical device creating a higher modulus of the gradient encapsulating material nearer the electrical device and to aggregate less densely farther from the electrical device creating a lower modulus of the gradient encapsulating material farther from the electrical device.

4. The apparatus of claim 1:
   wherein the gradient encapsulating material layered over and fully surrounding the electrical device is a mix of an elastomer with FeO (ferrous oxide) particles which respond to stimuli of a magnetic field; and
   wherein the magnetic field applied to the gradient encapsulating material prior to or during a curing process of the gradient encapsulating material causes the FeO particles to aggregate more densely nearer the electrical device creating a higher modulus of the gradient encapsulating material nearer the electrical device and to aggregate less densely farther from the electrical device creating a lower modulus of the gradient encapsulating material farther from the electrical device.

5. The apparatus of claim 1:
   wherein the gradient encapsulating material layered over and fully surrounding the electrical device is formed from at least two or more layers;
   wherein a first layer of the gradient encapsulating material corresponds to a first modulus, the first modulus of the first layer being greater than the stretchable substrate and less than the electrical device; and
   wherein a second layer of the gradient encapsulating material corresponds to a second modulus, the second modulus being greater than the stretchable substrate and less than the electrical device and different than the first modulus of the first layer.

6. The apparatus of claim 5:
   wherein the modulus of the gradient encapsulating material constituting at least the first and second layers varies in elasticity with increasing distance from the electrical device on a horizontal plane and varies in elasticity with increasing height from the electrical device on a vertical plane.

7. The apparatus of claim 1, wherein the electrical device comprises an integrated circuit and wherein the one or more electrical components electrically coupled with the electrical device comprise any one of:
   a battery, a sensor, a transceiver, a system on a chip (SOC).

8. The apparatus of claim 1, wherein the electrical device comprises a module package comprising at least a microelectronic die embedded in a processor and a memory and one or more communication circuits.

9. The apparatus of claim 1:
   wherein the one or more stretchable electrical interconnects coupled with the electrical device comprise electrical traces integrated into the stretchable substrate; and
   wherein the one or more stretchable electrical interconnects are coupled with the electrical device via at least one of electrical bonds, electrical pads, or flip chip interconnects.

10. The apparatus of claim 1, wherein the stretchable substrate comprises one of a stretchable polydimethylsiloxane (PDMS) substrate, a stretchable Polyisoprene substrate, a stretchable polybutadiene substrate, a stretchable polyisobutylene substrate, a stretchable polyurethanes substrate, a stretchable thermoplasticpolyurethanes substrate, a stretchable butyl rubber substrate, a stretchable nitrile rubber substrate, or a stretchable woven fabric substrate.

11. The apparatus of claim 10: wherein the stretchable substrate is layered over a dielectric material having the stretchable electrical interconnects integrated therein, wherein the stretchable electrical interconnects comprise one of meandering copper wires, electrical traces, springs wires, coiled wires, or spiraled wires; and wherein the stretchable electrical interconnects provide an electrical and communications interface between the electrical device and one or more electrical components through the dielectric material.

12. The apparatus of claim 1, wherein the apparatus is embedded within one of:
- a clothing item;
- sports attire;
- a shoe;
- a wearable technology to be worn as a clothing item or an accessory;
- fashion electronics to be worn as a clothing item or an accessory;
- tech togs to be worn as a clothing item or an accessory;
- fashionable technology to be worn as a clothing item or an accessory; or a flexible wearable technology to be worn as a clothing item or an accessory.

13. A wearable technology to be worn as a clothing item or an accessory, the wearable technology comprising:
- an integrated circuit on a stretchable substrate;
- one or more stretchable electrical interconnects coupled with the integrated circuit;
- one or more electrical components electrically coupled with the integrated circuit via the one or more stretchable electrical interconnects; and
- a gradient encapsulating material layered over and fully surrounding the integrated circuit and at least a portion of the one or more stretchable electrical interconnects coupled with the integrated circuit, wherein the gradient encapsulating material has an elastic modulus greater than the stretchable substrate and wherein the elastic modulus of the gradient encapsulating material is less than the integrated circuit, and wherein the gradient encapsulating material has a first elastic modulus proximate the electrical device and a second elastic modulus proximate the stretchable substrate, the second elastic modulus lower than the first elastic modulus.

14. The wearable technology of claim 13, wherein the wearable technology is embodied within one of:
- a clothing item;
- sports attire;
- a shoe;
- fashion electronics to be worn as a clothing item or an accessory; tech togs to be worn as a clothing item or an accessory;
- fashionable technology to be worn as a clothing item or an accessory; or
- a flexible wearable technology to be worn as a clothing item or an accessory.

15. The wearable technology of claim 13:
wherein the gradient encapsulating material layered over and fully surrounding the integrated circuit is a mix of an elastomer with particles which respond to stimuli; and
wherein a stimuli applied to the gradient encapsulating material prior to or during a curing process of the gradient encapsulating material causes the particles to aggregate more densely nearer the integrated circuit creating a higher modulus of the gradient encapsulating material nearer the integrated circuit and to aggregate less densely farther from the integrated circuit creating a lower modulus of the gradient encapsulating material farther from the integrated circuit.

* * * * *